United States Patent [19]

Bayraktaroglu

[11] Patent Number: 4,596,069

[45] Date of Patent: Jun. 24, 1986

[54] THREE DIMENSIONAL PROCESSING FOR MONOLITHIC IMPATTS

[75] Inventor: Burhan Bayraktaroglu, Plano, Tex.

[73] Assignee: Texas Instruments Incorporated, Dallas, Tex.

[21] Appl. No.: 630,485

[22] Filed: Jul. 13, 1984

[51] Int. Cl.[4] ...................... H01L 29/12; H01L 29/40
[52] U.S. Cl. .............................. 29/571; 148/DIG. 75; 148/DIG. 135; 357/13; 357/16; 357/56; 357/76; 29/576 J; 29/576 W; 29/580; 29/591
[58] Field of Search ............... 29/571, 576 J, 576 W, 29/580, 589, 591; 357/13, 56, 76, 77, 75, 81, 16; 148/DIG. 135, DIG. 71, DIG. 75

[56] References Cited

U.S. PATENT DOCUMENTS

| 3,383,760 | 5/1968 | Shwartzman ....................... 29/577 |
| 3,427,515 | 2/1969 | Blicher et al. ...................... 29/569 |
| 4,258,375 | 3/1981 | Hsieh et al. ..................... 357/13 X |
| 4,278,986 | 7/1981 | Mader ............................ 357/13 X |

FOREIGN PATENT DOCUMENTS 0041727  3/1980  Japan ................................. 357/13

Primary Examiner—Brian E. Hearn
Assistant Examiner—David A. Hey
Attorney, Agent, or Firm—Carlton H. Hoel; Robert O. Groover; James T. Comfort

[57] ABSTRACT

The disclosure relates to a monolithic circuit and method of making same which includes the use of two substrates of different semiconductor materials or two substrates of the same semiconductor material wherein the processing steps required for certain parts of the circuit are incompatible with the processing steps required for other parts of the circuit.

12 Claims, 8 Drawing Figures

THREE DIMENSIONAL PROCESSING FOR MONOLITHIC IMPATTS

BACKGROUND OF THE INVENTION

1. Field of the Invention

This invention relates to the production of monolithic semiconductor circuits utilizing at least two different semiconductor substrate materials or utilizing a single semiconductor substrate material wherein processing steps for certain parts of the circuit are incompatible with processing steps for other parts thereof.

2. Description of the Prior Art

Monolithic semiconductor circuits wherein complete circuits are provided on a single semiconductor substrate have been well known for many years. Such prior art semiconductor substrates have had the advantage of close proximity to each other of the circuit elements therein, this feature being extremely important as the frequencies utilized increase. These prior art monolithic circuits have required that all of the components be formed in a substrate containing a single semiconductor material and have also required that the processing steps for all of the components therein be compatible with each other within the bounds of economics. For this reason, when it has become necessary to provide circuits utilizing substrates of differing semiconductor materials or of the same semiconductor material but wherein the processing steps were incompatible, it has been necessary to use a plurality of semiconductor chips to provide the desired circuit configuration. A typical example of this problem exists in the fabrication of a circuit utilizing an IMPATT structure and associated circuitry containing FETs, varactors, etc., wherein operation is in the microwave region. In such cases, it is necessary, due to the totally incompatible processing techniques in formation of IMPATTs relative to other standard circuitry that the IMPATT be formed on a separate semiconductor chip. This has presented a problem in the prior art in that it is desirable that the components be as close together as possible in the microwave operating region to prevent a limit in device performance due to the parasitic elements associated with the transitions that exist.

SUMMARY OF THE INVENTION

In accordance with the present invention, there is provided a monolithic semiconductor circuit and a method of making such monolithic circuit wherein components of the circuit are formed either on substrates of different semiconductor materials or of the same semiconductor material but wherein the processing steps are incompatible so that the circuit components can be closely spaced and minimize problems inherent with distant spacing of components as noted hereinabove.

While the present invention can be utilized for any type of device wherein the problems enumerated hereinabove exist, a specific embodiment will be shown and described herein wherein a monolithic semiconductor circuit is provided having an IMPATT and other standard semiconductor circuitry to form a complete circuit.

Briefly, such circuitry is formed by providing two semiconductor wafers made of, for example, gallium arsenide, one of the wafers optionally including standard circuitry therein such as FETs, varactors, etc. A polyimide layer is formed over the active surface of this wafer and a second wafer is positioned over the polyimide layer with the active layer thereof against the polyimide layer. The active layer of the second wafer will include an IMPATT structure therein. The first wafer is then etched away in the region beneath the portion of the second wafer wherein the final IMPATT structure will be formed and the polyimide in that region is also removed. The aperture is then filled with a heat sink material, such as copper or gold, and the second wafer is then etched away, leaving only the active layer thereof. At this point, a metallization layer is deposited on the portion of the active area of the second wafer where the IMPATT is to be ultimately formed, acting as an etchant mask, and then the said active layer of the second wafer is etched away, leaving only the active layer portion thereof below the metallization layer disposed on the metal heat sink with the metallization layer thereon. The polyimide is then removed and microwave circuits which may be in the form of microstrip lines, are then formed on the surface of the surface of the first wafer. A polyimide layer is then formed so that it extends above the IMPATT and at least in the region between the IMPATT and the microwave circuits. The polyimide is removed in the region above the IMPATT metallization layer and an electrically conductive bridge formation is formed over the polyimide from the metallization on the IMPATT to the microwave circuit to complete the circuit. It can be seen that there has been produced a monolithic semiconductor circuit containing an IMPATT and other circuitry, all as a single member.

Though the above described procedure has indicated the formation of circuit elements in the first wafer prior to formation of the monolithic circuit, it is also possible to form such circuit elements in the first wafer after completion of the monolithic circuit with the IMPATT therein. Also, though both substrates utilized herein are shown to be gallium arsenide, it is readily apparent that the circuit would operate equally well if, for example, the first wafer were formed from silicon, germanium or other semiconductor materials different from that used for the IMPATT.

It is readily apparent from the above discussion that there has been provided a method for producing a monolithic semiconductor circuit utilizing either components formed on substrates of different semiconductor material or of the same semiconductor material but wherein the processing steps in different portions of the circuit are totally incompatible with each other and cannot be formed together in an economic manner.

DESCRIPTION OF THE PREFERRED EMBODIMENT

Figure 1A:
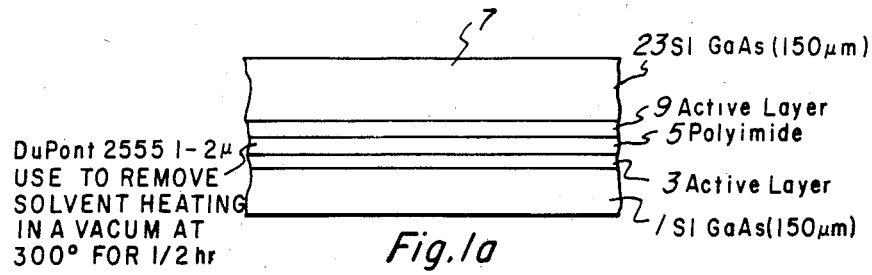
FIG. 1a–g is a schematic diagram of the processing steps utilized in forming a monolithic semiconductor circuit in accordance with the present invention.
Figure 1B:
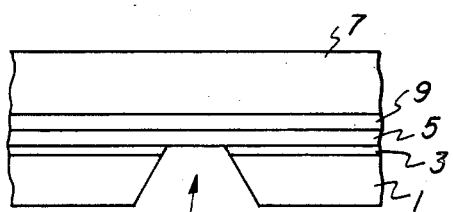
Figure 1C:
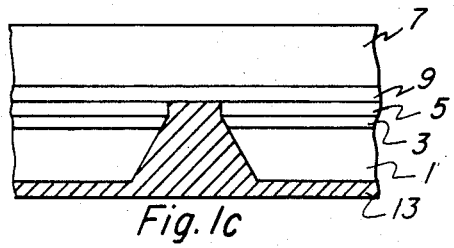

Referring now to FIG. 1, there is shown a schematic diagram of the processing steps utilized in formation of a monolithic semiconductor circuit in accordance with the present invention. In accordance with the process as shown in FIG. 1(a), there is provided a first gallium arsenide substrate 1 having an active layer 3 on the top surface thereof which may have components formed therein at this point or wherein the components can be formed later in the process as will be described hereinbelow. A polyimide layer portion 5, preferably DuPont Polyimide 2555, which is applied approximately 1 to 2 microns in thickness is formed over the active layer 3 and is cured to remove solvents therein by heating in a vacuum at about 300° C. for a half hour. A second gallium arsenide substrate 7 with an active layer 9 thereon in the form of an IMPATT structure, as will be explained hereinbelow in connection with FIG. 2 with a fresh uncured layer portion 5 of polyimide on the active region surface, is positioned over the cured polyimide layer portion 5 with the active layer 9 disposed on the polyimide layer so that the active layers 3 and 9 are positioned face to face. The polyimide layer portions 5 are again cured to remove solvents therefrom and the wafers 1 and 7 are then bonded together by means of the polyimide layer portions, now one layer 5. A via hole 11, as shown in FIG. 1(b) is then produced in the bottom wafer 1 by masking the bottom wafer in the region directly below the location where the IMPATT structure will ultimately be formed and etching with a standard gallium arsenide etch, such as hydrogen peroxide and sulfuric acid, as is well known. The polyimide layer 5 will act as an etch stop and protect the top wafer 7 from being etched. The result will be the structure shown in FIG. 1(b).

The portion of the polyimide layer 5 above the hole 11 is then removed by use of an oxygen plasma which burns off the polyimide in the hole region. The hole 11, including the portion from the polyimide has been removed, is then filled with an electrically conductive heat sink metal by evaporating Ti-Au to provide electrical contact during plating that follows. Preferred heat sink metals are gold, silver and copper for this purpose. The result is the structure shown in FIG. 1(c) wherein the metal also acts as a ground plane in the ultimate structure. The top wafer 7 is then etched, utilizing a selective gallium arsenide etch, such as $H_2O_2$ and $NH_4OH$ to remove the substrate portion 23 thereof. This etching will take place down to the active layer 9 wherein the etching will cease as soon as the aluminum gallium arsenide layer 31 has been reached, since this layer acts as an etch stop to the selective gallium arsenide etchant. The aluminum gallium arsenide layer 31 is then removed by use of a hot HCl or HF etchant as is well known. The resulting structure as shown in FIG. 1(d) will include the lower wafer 1 with metallization 13 thereon, the polyimide layer 5 and the portion of the active layer 9 which includes the N+ layer 33, the N-type layer 35, the P-type layer 37 and P+ layer 39, the latter being adjacent the polyimide layer and positioned on the metallization 13.

Figure 1D:
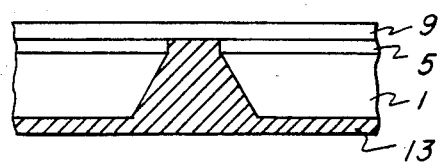
Figure 1E:
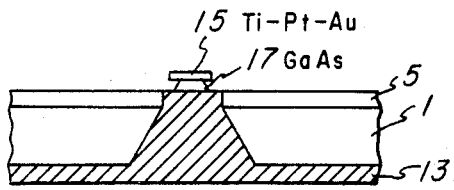
Figure 1F:
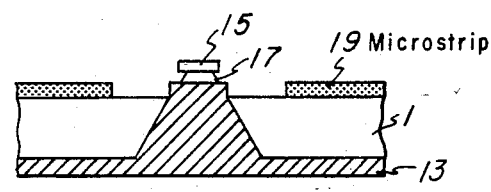
Figure 1G:
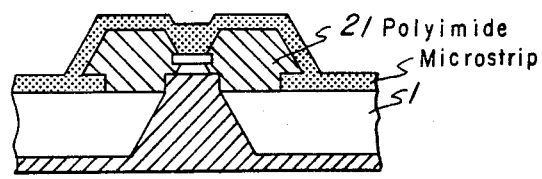

The structure of FIG. 1(d) is then masked and metallization is then formed over the region where the final IMPATT structure is to be formed. This metallization is formed by placing down a layer of titanium of about 1,000 angstroms, then a layer of platinum of about 500 angstroms and then a layer of gold of about ½ to 1 micron, these being evaporated onto the exposed portion of the active layer 9 successively with subsequent removal of the photoresist in standard manner. The remainder of the active layer 9 is then etched, utilizing a gallium arsenide etchant, such as hydrogen proxide and sulfuric acid, with the metallization 15 acting as an etchant mask so that the gallium arsenide is removed except for the region under the metallization 15. The remaining structure as shown in FIG. 1(e) includes the IMPATT device 17 which is about 50 to 100 microns across whereas undercutting will be about 1 to 2 microns, thereby providing a substantial amount of material for the IMPATT structure. The remainder of the polyimide layer 5 is then removed by burn off using an oxygen plasma and a circuit in the form of microstrips 19 is then formed over the now exposed active layer 3 or the substrate of the wafer 1 by use of a photoresist and deposition of an electrically conducted metal such as, for example, a thin layer of titanium followed by a layer of gold, the thickness of the gold layer being at least twice the skin depth of the frequency at which the circuit is to be operated. For example, if the circuit is to operate at 30 gigahertz, then a ½ micron microstrip metal 19 would be utilized. The resulting structure is shown in FIG. 1(f).

A polyimide layer 21 which is higher than the IMPATT structure 15 is then formed over the top surface of the device, this layer being on the order of 25 microns and an aperture is then burned into the polyimide layer 21 by oxygen plasma over the IMPATT device and also the microstrip 19 is exposed by removal of polyimide thereover in order to provide exposed surfaces for interconnection. A thin layer of electrically conductive metal, preferably gold, is then deposited over the polyimide from the IMPATT device 15 to the microstrip 19 and all extraneous polyimide 21 is then removed from the surface of the device to provide the final structure shown in FIG. 1(g).

Figure 2:
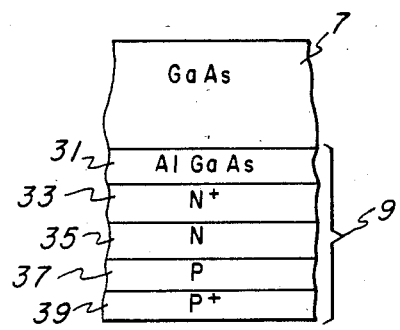
FIG. 2 is a schematic diagram of a typical IMPATT structure.

Referring now to FIG. 2, there is shown a schematic diagram of a typical IMPATT structure. The wafer 7 includes a gallium arsenide substrate 3 having formed thereon successively a layer of aluminum gallium arsenide 31 which acts as an etchant stop for gallium arsenide etchant, an N+ layer 33, an N-type layer 35, a P-type layer 37 and a P+ layer 39 on the outer surface. The active layer 9 comprises the layers 31 through 39.

As an alternative, as noted hereinabove, the active layer 3 need not have devices formed therein initially but can have them formed therein subsequent to removal of the polyimide layer 5 as shown in FIG. 1(e) and prior to formation of the microstrip 19.

It can be seen that there has been provided a monolithic semiconductor structure containing an IMPATT device 19 which has totally dissimilar fabrication processing steps that are required for formation of circuit elements in the substrate 1. It is also readily apparent that the procedure set forth hereinabove would operate equally well if the substrate 1 were formed from a semiconductor material other than gallium arsenide, whereby a monolithic semiconductor structure would be provided utilizing two different semiconductor substrate materials.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of forming a monolithic semiconductor structure, comprising the steps of:
   (a) providing a pair of semiconductor wafers, each having an active region on one side thereof, the processing steps to be performed on one of said wafers being incompatible with the processing steps to be performed on the other of said wafers;

(b) securing said wafers to a bonding layer disposed therebetween with the active regions thereof facing each other;
(c) forming an aperture entirely through one of said wafers extending to said bonding layer;
(d) removing the portion of said bonding layer from said aperture;
(e) filling said aperture with a heat sink material contacting the other of said wafers;
(f) metallizing a predetermined region of the other of said wafers entirely over said heat sink material;
(g) removing the other of said wafer except for the portion thereof beneath said metallization;
(h) insulating said wafers from each other; and
(i) electrically coupling said wafers.

2. The method of claim 1 further including, after step (g), removing the remainder of said bonding layer.

3. The method of claim 1 further including, after step (g), forming a microstrip on said one of said wafers.

4. The method of claim 2 further including forming a microstrip on said one of said wafers.

5. The method of claim 1 wherein step (i) comprises forming a conductor over the insulation formed in step (h).

6. The method of claim 2 wherein step (i) comprises forming a conductor over the insulation formed in step (h).

7. The method of claim 3 wherein step (i) comprises forming a conductor over the insulation formed in step (h).

8. The method of claim 4 wherein step (i) comprises forming a conductor over the insulation formed in step (h).

9. A method of forming a monolithic semiconductor structure comprising the steps of:

(a) providing first and second semiconductor wafers each having an active region on one surface thereof;
(b) securing said wafers to a bonding layer with the active regions facing each other;
(c) forming an aperture through a predetermined portion of said first wafer;
(d) removing the bonding layer portion exposed in said aperture;
(e) filling said aperture with a heat sink material so the said heat sink material contacts the second wafer;
(f) removing said second wafer except for said active region;
(g) forming an electrically conductive etch stop on the active region of said second wafer only over said heat sink;
(h) removing said active layer of said second wafer not beneath said etch stop;
(i) removing the remaining bonding layer;
(j) forming at least one electrical component on and/or in said first wafer;
(k) electrically insulating said first wafer from said second wafer; and
(l) electrically coupling said second wafer to said electrical component.

10. A method as set forth in claim 9 wherein said bonding layer is formed of a polyimide.

11. A method as set forth in claim 9 wherein said first and second wafers are composed of different semiconductor materials.

12. A method as set forth in claim 10 wherein said first and second wafers are composed of different semiconductor materials.

* * * * *